United States Patent
van Erven et al.

(10) Patent No.: US 10,361,484 B2
(45) Date of Patent: Jul. 23, 2019

(54) ANTENNA SELECTION

(71) Applicant: Sonos, Inc., Santa Barbara, CA (US)

(72) Inventors: Niels van Erven, Agoura Hills, CA (US); Carlo van Niekerk, Santa Barbara, CA (US); Michael Frey, Tyngsboro, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 15/966,499

(22) Filed: Apr. 30, 2018

(65) Prior Publication Data

US 2018/0323506 A1    Nov. 8, 2018

Related U.S. Application Data

(63) Continuation of application No. 15/341,688, filed on Nov. 2, 2016, now Pat. No. 9,960,488, which is a
(Continued)

(51) Int. Cl.
*H03G 5/02* (2006.01)
*H01Q 3/24* (2006.01)
(Continued)

(52) U.S. Cl.
CPC ............... *H01Q 3/24* (2013.01); *G06F 3/162* (2013.01); *G06F 3/165* (2013.01); *H03G 5/165* (2013.01);
(Continued)

(58) Field of Classification Search
CPC ...... H01Q 1/2266; H01Q 1/243; H01Q 1/245; H04B 7/0617; H04B 7/0602;
(Continued)

(56) References Cited

U.S. PATENT DOCUMENTS

| 5,440,644 A | 8/1995 | Farinelli et al. |
| 5,455,592 A | 10/1995 | Huddle |
(Continued)

FOREIGN PATENT DOCUMENTS

| EP | 1389853 A1 | 2/2004 |
| EP | 2228868 A1 | 9/2010 |
(Continued)

OTHER PUBLICATIONS

AudioTron Quick Start Guide, Version 1.0, Mar. 2001, 24 pages.
(Continued)

*Primary Examiner* — Norman Yu
(74) *Attorney, Agent, or Firm* — McDonnell Boehnen Hulbert & Berghoff LLP

(57) ABSTRACT

A network device communicates with one or another set of antennas depending on an orientation of the network device. The network device includes a first set of one or more antennas, a second set of one or more antennas, a processor, and memory having stored thereon instructions executable by the processor to cause the device to perform functions. The functions include (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

17 Claims, 8 Drawing Sheets

Related U.S. Application Data continuation of application No. 14/696,041, filed on Apr. 24, 2015, now Pat. No. 9,917,364.

(51) Int. Cl.

| | | |
|---|---|---|
| *H04S 7/00* | (2006.01) | |
| *G06F 3/16* | (2006.01) | |
| *H04R 3/12* | (2006.01) | |
| *H03G 5/16* | (2006.01) | |
| *H04B 7/08* | (2006.01) | |
| *H04R 3/04* | (2006.01) | |
| *H04R 29/00* | (2006.01) | |

(52) U.S. Cl.
CPC ............ *H04B 7/0834* (2013.01); *H04R 3/04* (2013.01); *H04R 3/12* (2013.01); *H04R 29/007* (2013.01); *H04S 7/302* (2013.01); *H04S 7/303* (2013.01); *H04R 2227/003* (2013.01); *H04R 2227/005* (2013.01); *H04S 7/307* (2013.01)

(58) Field of Classification Search
CPC ... H04B 7/0404; G06F 1/1616; G06F 1/1624; H04W 52/14; H04W 52/143; H04W 52/26; H04W 52/0245; H04W 84/12; H04W 84/18; H04W 16/28; H04W 24/02; H04W 4/025; H04W 4/026; H04W 4/04; H04M 2250/12; H04R 2420/07; H04R 25/554; H04R 3/00
USPC ....... 455/522, 15, 3.01, 41.1, 41.2, 65.4, 68, 455/73; 343/893, 844; 342/368, 372
See application file for complete search history.

(56) References Cited

U.S. PATENT DOCUMENTS

| | | | |
|---|---|---|---|
| 5,761,320 | A | 6/1998 | Farinelli et al. |
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,483,538 | B2 | 1/2009 | McCarty et al. |
| 7,571,014 | B1 | 8/2009 | Lambourne et al. |
| 7,629,880 | B2 | 12/2009 | Stilp et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,925,203 | B2 | 4/2011 | Lane et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington et al. |
| 8,483,853 | B1 | 7/2013 | Lambourne |
| 8,934,647 | B2 | 1/2015 | Joyce et al. |
| 8,934,655 | B2 | 1/2015 | Breen et al. |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty |
| 2004/0024478 | A1 | 2/2004 | Hans et al. |
| 2007/0142944 | A1 | 6/2007 | Goldberg et al. |
| 2009/0322621 | A1 | 12/2009 | Inanoglu et al. |
| 2010/0265137 | A1 | 10/2010 | Ono |
| 2012/0190398 | A1* | 7/2012 | Leukkunen .......... H04B 7/0691 455/522 |
| 2012/0309326 | A1 | 12/2012 | Maguire |
| 2013/0022221 | A1 | 1/2013 | Kallai et al. |
| 2013/0095875 | A1* | 4/2013 | Reuven ................... H04B 7/10 455/509 |
| 2014/0226837 | A1 | 8/2014 | Grokop |
| 2014/0334322 | A1 | 11/2014 | Shtrom et al. |
| 2015/0031287 | A1 | 1/2015 | Pang et al. |

FOREIGN PATENT DOCUMENTS

| | | |
|---|---|---|
| JP | 2005341541 A | 12/2005 |
| WO | 200153994 | 7/2001 |
| WO | 2003093950 A2 | 11/2003 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: the ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
International Searching Authority, International Preliminary Report on Patentability dated Oct. 24, 2017, issued in connection with International Application No. PCT/US2016/028468 filed on Apr. 20, 2016, 10 pages.
International Searching Authority, International Search Report and Written Opinion dated Nov. 17, 2016, issued in connection with International Patent Application No. PCT/US2016/028468, filed on Apr. 20, 2016, 17 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action dated Dec. 7, 2016, issued in connection with U.S. Appl. No. 15/341,688, filed Nov. 2, 2016, 23 pages.
Non-Final Office Action dated Jun. 7, 2017, issued in connection with U.S. Appl. No. 15/341,688, filed Nov. 2, 2016, 30 pages.
Non-Final Office Action dated Apr. 14, 2017, issued in connection with U.S. Appl. No. 14/696,041, filed Apr. 24, 2015, 24 pages.
Notice of Allowance dated Sep. 13, 2016, issued in connection with U.S. Appl. No. 14/696,041, filed Apr. 24, 2015, 15 pages.
Notice of Allowance dated Dec. 21, 2017, issued in connection with U.S. Appl. No. 15/341,688, filed Nov. 2, 2016, 8 pages.
Notice of Allowance dated Oct. 23, 2017, issued in connection with U.S. Appl. No. 14/696,041, filed Apr. 24, 2015, 12 pages.
Notification of Reopening of Prosecution Due to Consideration of an Information Disclosure Statement Filed After Mailing of a Notice of Allowance dated Jan. 19, 2017, issued in connection with U.S. Appl. No. 14/696,041, filed Apr. 24, 2015, 2 pages.
Palm, Inc., "Handbook for the Palm VII Handheld," May 2000, 311 pages.
Preinterview First Office Action dated Jun. 10, 2016, issued in connection with U.S. Appl. No. 14/696,041, filed Apr. 24, 2015 5 pages.
Presentations at WinHEC 2000, May 2000, 138 pages.

(56) References Cited

OTHER PUBLICATIONS

United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

\* cited by examiner

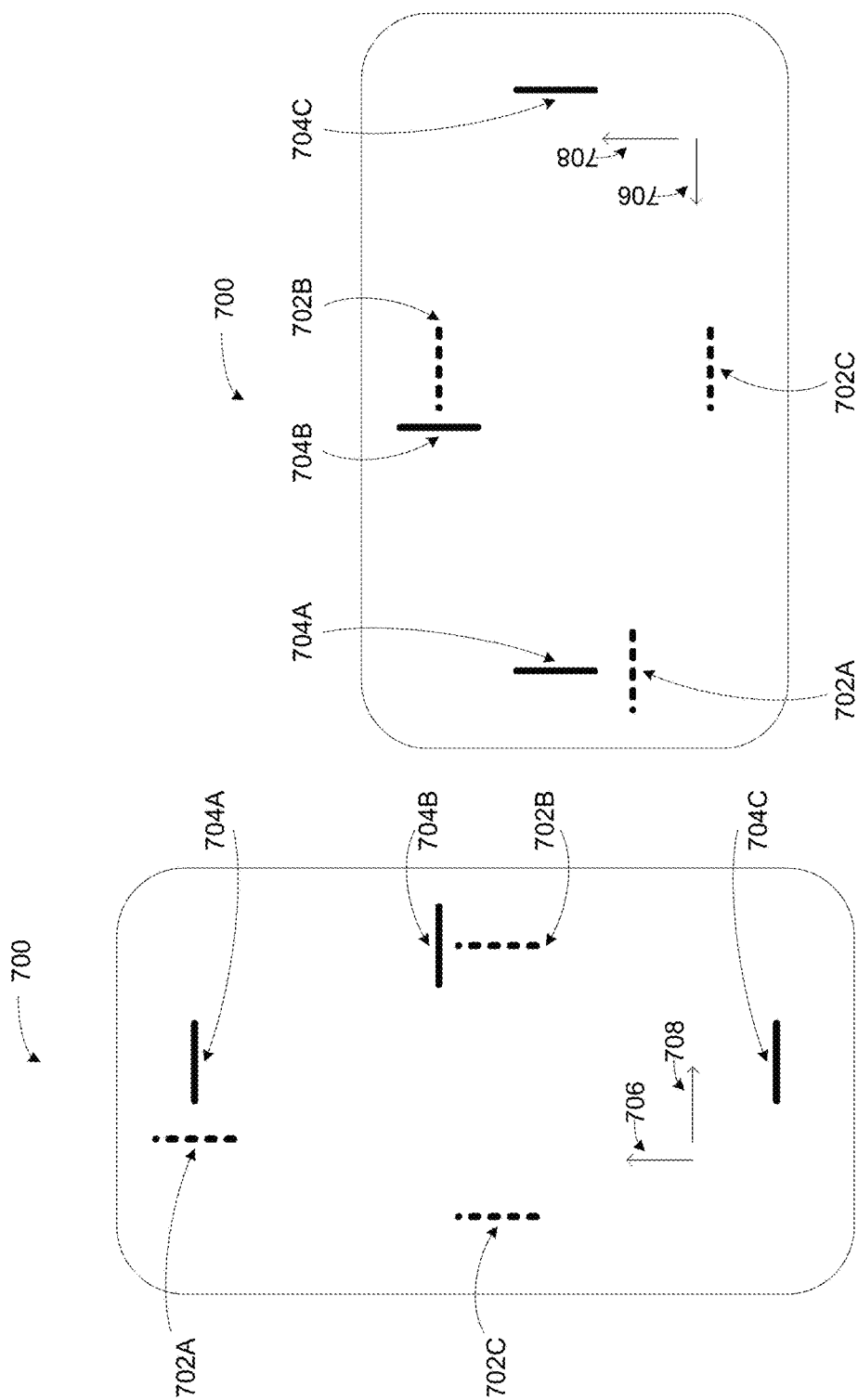

ANTENNA SELECTION

CROSS REFERENCE TO RELATED APPLICATIONS

This application is a continuation of U.S. non-provisional patent application Ser. No. 15/341,688, filed on Nov. 2, 2016, entitled "Antenna Selection," which is incorporated herein by reference in its entirety.

U.S. non-provisional patent application Ser. No. 15/341,688 is a continuation of U.S. non-provisional patent application Ser. No. 14/696,041, filed on Apr. 24, 2015, entitled "Antenna Selection," and issued as U.S. Pat. No. 9,917,364 on Mar. 13, 2018, which is incorporated herein by reference in its entirety.

This application is related to U.S. patent application Ser. No. 13/186,249, filed Jul. 19, 2011, entitled "Shaping Sound Responsive to Speaker Orientation," which is incorporated herein in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIGS. 7A and 7B show an example playback device including example antennas, according to an example implementation;

Figure 1:
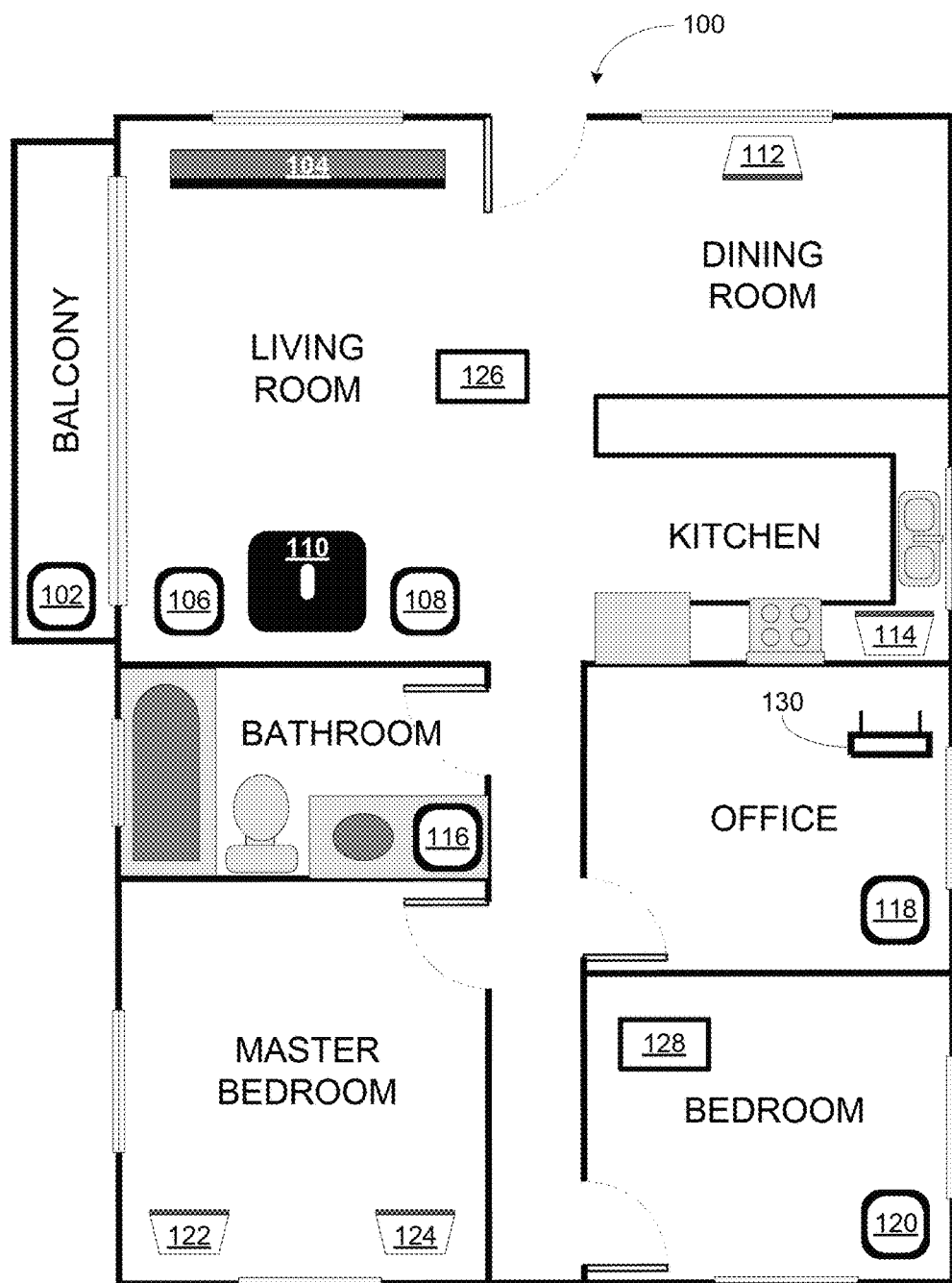
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Some embodiments described herein involve causing a network device to communicate with one or another set of antennas depending on an orientation of the network device. In one embodiment, the network device is a playback device, capable of playing back audio, that communicates with other network devices using the one or another set of antennas. The playback device may be arranged in multiple orientations depending, perhaps, on a user's preference. The playback device may switch between use of given sets of antennas depending on an orientation of the playback device to help ensure that the playback device maintains a level of communication quality while in either orientation.

In an example, when the playback device is arranged in a vertical orientation, the playback device may then communicate using a first set of one or more antennas. In some cases, each antenna in the first set of one or more antennas may also be arranged vertically. As a result, the radiation pattern of the collective first set of one or more antennas will beneficially be substantially horizontal, along the azimuth of the vertically arranged playback device.

In another example, when the playback device is arranged in a horizontal orientation, the playback device may then communicate using a second set of one or more antennas. In some cases, each of the second set of one or more antennas may be arranged perpendicularly to each of the first set of one or more antennas. Accordingly, when the playback device is arranged horizontally, each antenna in the second set of one or more antennas will be arranged vertically. As a result, the radiation pattern of the collective second set of one or more antennas will beneficially be substantially horizontal, along the azimuth of the horizontally arranged playback device.

In other examples, the first set of one or more antennas and the second set of one or more antennas may share at least one antenna. In this way, the shared at least one antenna may be used for communication by the playback device when the playback device is in multiple orientation.

As indicated above, the examples provided herein involve causing a network device to communicate with one or another set of antennas depending on an orientation of the network device. In one aspect, a network device is provided. The device includes a first set of one or more antennas, a second set of one or more antennas, a processor, and memory having stored thereon instructions executable by the processor to cause the device to perform functions. The functions include (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

In another aspect, a method is provided. The method involves (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

In yet another aspect, a non-transitory computer readable memory is provided. The non-transitory computer readable memory has stored thereon instructions executable by a computing device to cause the computing device to perform operations. The operations include (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

While some examples described herein may refer to functions performed by given actors such as "users" and/or other entities, it should be understood that this is for purposes of explanation only. The claims should not be interpreted to require action by any such example actor unless explicitly required by the language of the claims themselves. It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
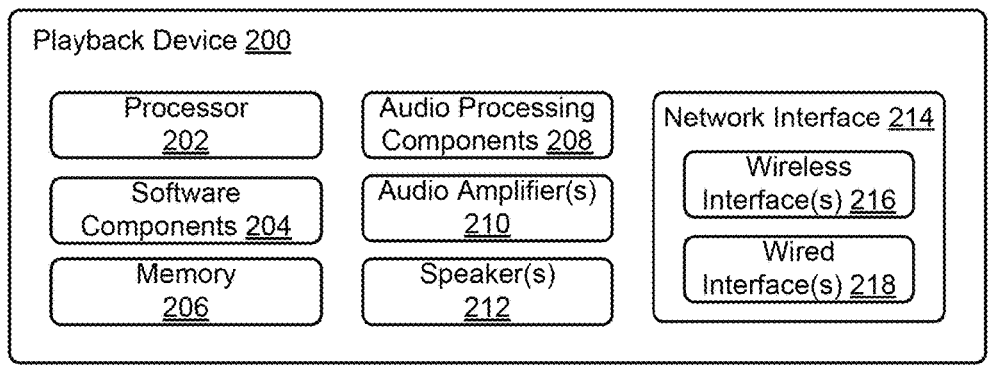
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
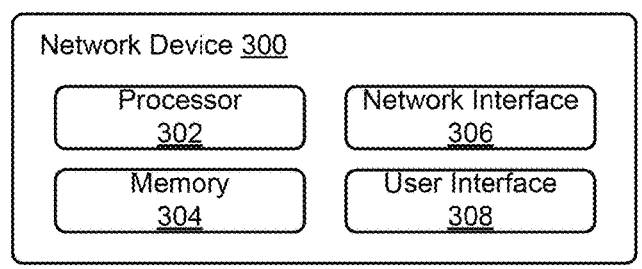
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
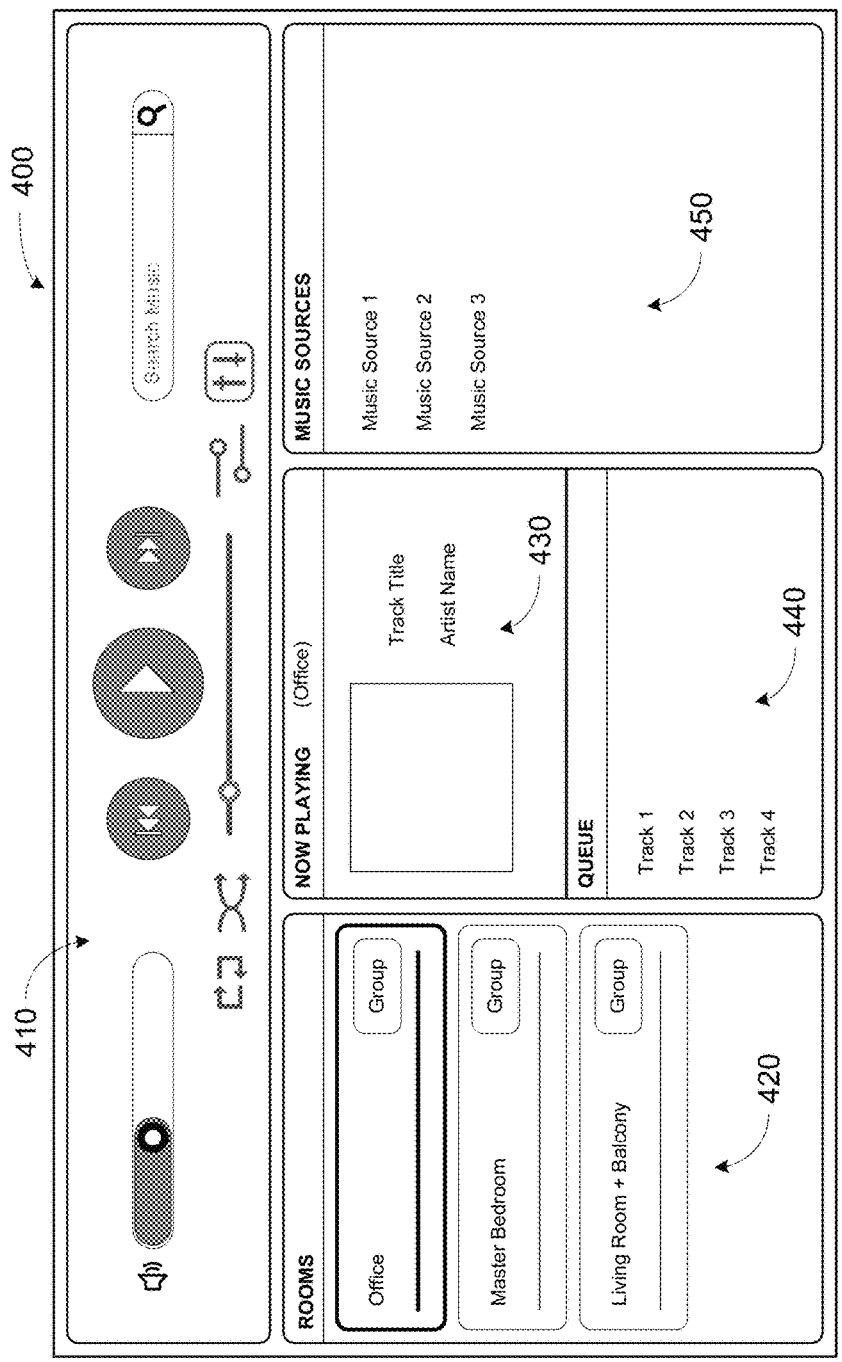
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Technique to Select Antennas for Communication

As discussed above, embodiments described herein may involve causing a network device to communicate using one or another set of antennas depending on an orientation of the network device.

Figure 5:
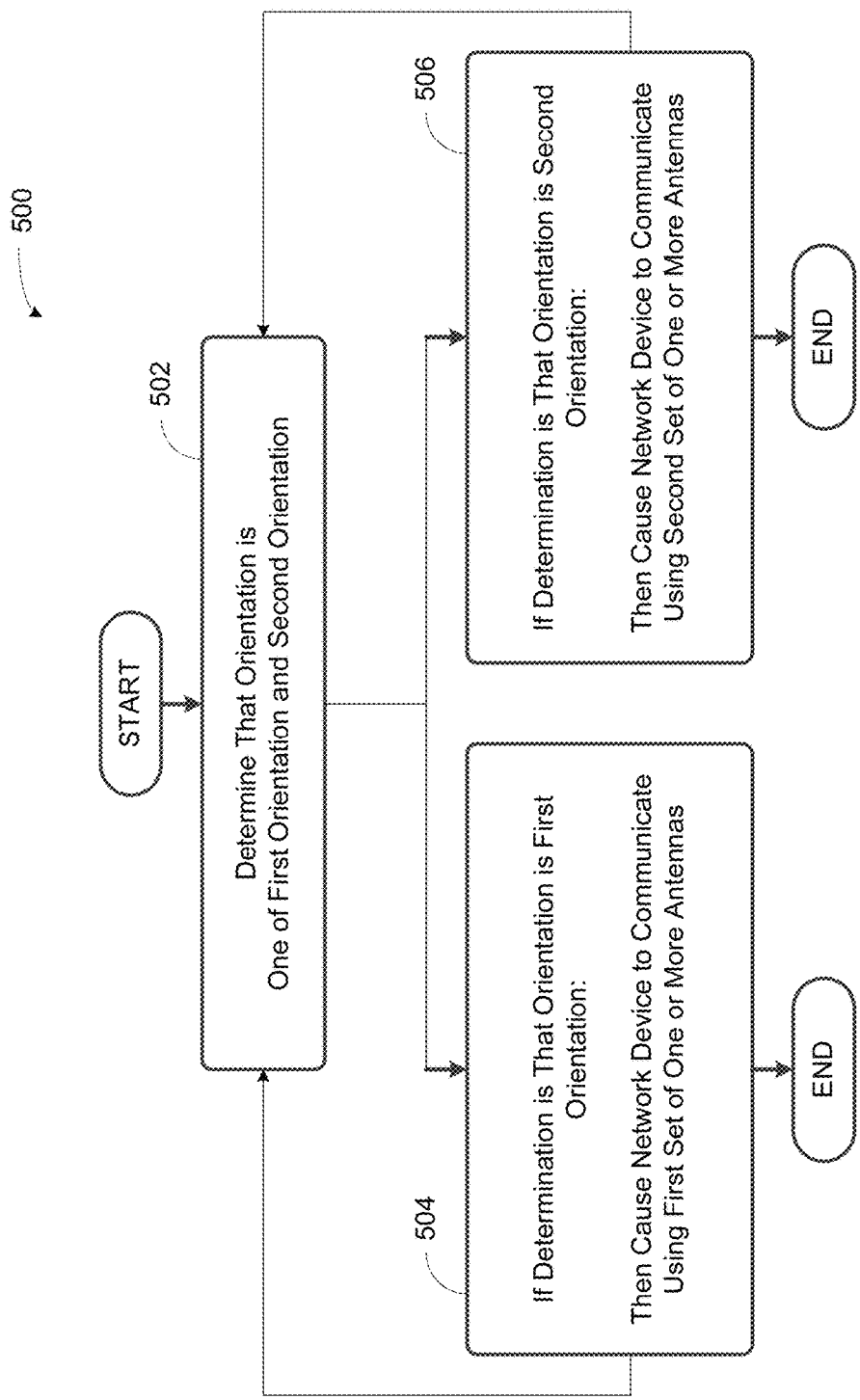
FIG. 5 shows an example flow diagram for communication using a first set of one or more antennas or a second set of one or more antennas.

Implementation 500 shown in FIG. 5 presents an embodiment of a method that can be implemented within an operating environment involving, for example, the media playback system 100 of FIG. 1, one or more of the playback device 200 of FIG. 2, and one or more of the control device 300 of FIG. 3. Implementation 500 may include one or more operations, functions, or actions as illustrated by one or more of blocks 502-506. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the implementation 500 and other implementations disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 500 and other processes and methods disclosed herein, each block in FIG. 5 may represent circuitry that is wired to perform the specific logical functions in the process.

As shown in FIG. 5, at block 502, implementation 500 involves determining that an orientation of a network device is one of a first orientation and a second orientation. At block 504, if the determined orientation is the first orientation, implementation 500 involves causing the network device to communicate using the first set of one or more antennas. At block 506, if the determined orientation is the second orientation, implementation 500 involves causing the network device to communicate using the second set of one or more antennas. These and other example functions are discussed in further detail below.

A. Determine that Orientation is One of First Orientation and Second Orientation At block 502, implementation 500 involves determining that an orientation of a network device is one of a first orientation and a second orientation.

In an embodiment, block 502 and other functions described with respect to method 500 may be performed by the network device itself. For instance the network device may include a processor and memory having stored thereon instructions executable by the processor to cause the processor to perform the functions described with respect to method 500.

In another embodiment block 502 and/or some or all of the other functions described with respect to method 500 may be performed by a controller or another network device that is communicatively coupled to the network device perhaps via a local and/or wide area network.

Figure 6A:
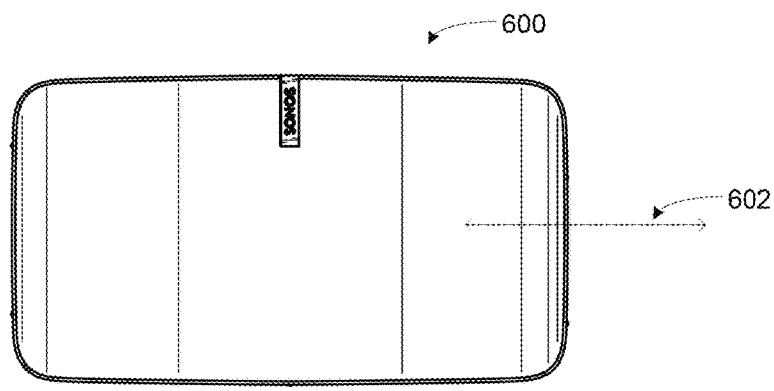
FIGS. 6A, 6B, and 6C show an example playback device in various orientations, according to an example implementation.
Figure 6B:
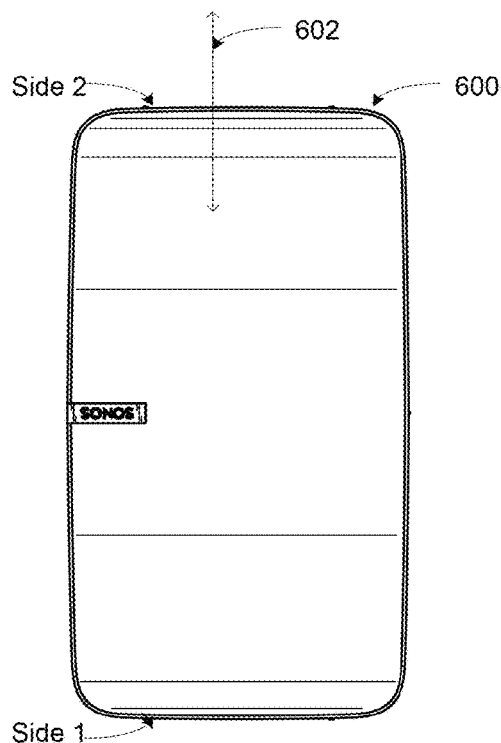
Figure 6C:
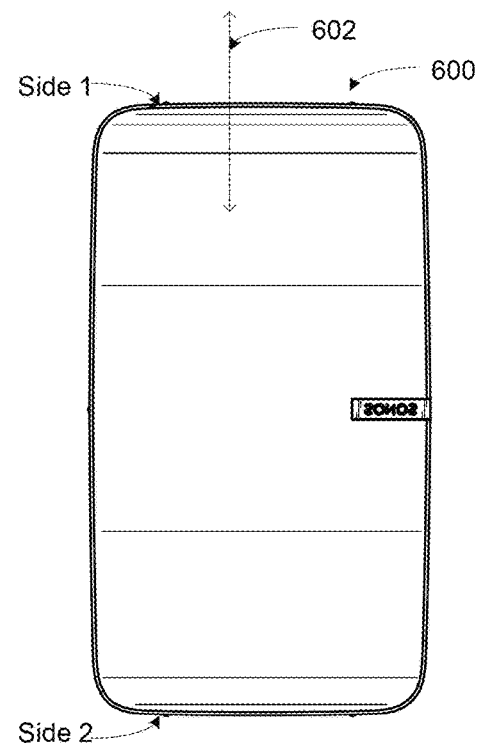

In an embodiment, the network device referred to with respect to block 502 may be a playback device such as any playback device described elsewhere herein. FIGS. 6A, 6B, and 6C show an example playback device 600 that may perform the functions described with respect to block 502 and other functions described with respect to method 500.

FIGS. 6A, 6B, and 6C show playback device 600 in a variety of orientations. With respect to FIGS. 6A and 6B in particular, playback device 600 is shown in a first orientation and a second orientation, respectively.

In both FIGS. 6A and 6B, playback device 600 is shown as having longitudinal axis 602. In FIG. 6A, playback device 600 is shown as having a longitudinal axis that is horizontal. As such, in FIG. 6A, playback device is shown as having a horizontal orientation. On the other hand, in FIG. 6B, playback device 600 is shown as having a longitudinal axis that is vertical. As such, in FIG. 6B, playback device 600 is shown as having a vertical orientation.

While FIGS. 6A and 6B show playback device 600 oriented horizontally and vertically, respectively, it should be understood that the playback device may assume other orientations as well. Indeed, the playback device may assume any other angular orientation. In practice, for instance, the playback device may not be lying completely flat and may instead be positioned at an angle. Nonetheless, even in such a situation where the playback device is positioned at an angle, in some situations that position may be treated as a substantially horizontal or a substantially vertical orientation despite not being an exactly horizontal or an exactly vertical orientation.

In some embodiments, an orientation sensor may be used to determine the orientation of the playback device in which the orientation sensor is positioned. For instance, an orientation sensor, such as an accelerometer among other examples, may be used to determine an orientation of the playback device. In examples, an accelerometer may be mounted in a playback device such that the axes of the accelerometer are either aligned with the grille plane or are orthogonal to the grille plane.

Those of skill in the art will appreciate that some suitable accelerometers will enable determination of orientation in the presence of disruptive environmental conditions, such as acoustic noise, and/or variation in tolerance based on at least one of temperature variation and manufacturing variation, among other examples.

In examples, to help ensure that orientation sensing is not adversely affected by acoustic vibration (e.g., through inducing mechanical stress which manifests as additional acceleration beyond that produced by gravity), the raw acceleration values may be filtered. The filtering may lead to an increase in response time to determining an orientation change. Additionally, in order to help reduce or prevent frequent orientation changes in the presence of noise (e.g., a poor wall mount), orientation changes may be limited to a certain period of time (e.g., limiting orientation changes to one every thirty seconds).

In examples, pitch, roll, and yaw of the playback device may be used to determine an orientation of the playback device. Roll pitch angles may be measured in reference to the "plane" of a front grille of the playback device (e.g., referenced to the plane formed by tangents at a center of the grille).

Other example aspects of determining the orientation of a network device such as a playback device are described in U.S. patent application Ser. No. 13/186,249, filed Jul. 19, 2011, entitled "Shaping Sound Responsive to Speaker Orientation," which is incorporated by reference herein.

As noted above, while block 502 refers to a first orientation and second orientation, other orientations of the network device are possible. As one additional example, FIG. 6C depicts playback device 600 in a third orientation, which is an additional possible vertical orientation different from the vertical orientation shown in FIG. 6B. As shown, whereas side 1 is below side 2 in FIG. 6B, side 1 is above side 2 in FIG. 6C. Playback device 600 may be arranged to distinguish between the vertical orientations depicted in FIG. 6B and FIG. 6C. And the different orientations as shown in FIGS. 6B and 6C may be used to affect functions described with respect to method 500.

It should be noted that although block 502 refers to determining that the orientation is one of a first orientation and a second orientation, the playback device may be arranged in orientations other than the first orientation or the second orientation, and that the network device may also determine that the playback device is in some orientation other than the first orientation or the second orientation. In such a situation where the orientation is determined to be an orientation other than a first or a second orientation, the playback device may perform functions that are the same, similar, and/or different from those described with respect to method 500.

B. If Determination is that Orientation is First Orientation, then Causing Network Device to Communicate Using First Set of One or More Antennas At block 504, implementation 500 involves, if the determined orientation is the first orientation, then causing the network device to communicate using the first set of one or more antennas.

As explained with respect to block 502 above, in an embodiment the network device may be a playback device such as playback device 600. Further aspects of an example playback device 700 are shown with respect to FIGS. 7A and 7B. In FIG. 7A, playback device 700 is shown in a first orientation. In FIG. 7B, playback device 700 is shown in a second orientation.

As shown, playback device includes two sets of antennas including a first set of antennas (corresponding to a "702" numbering scheme) and a second set of antennas (corresponding to a "704" numbering scheme). The first set of antennas is shown as including antenna 702A, antenna 702B, and antenna 702C. The second set of antennas is shown as including antenna 704A, antenna 704B, and antenna 704C.

The various antennas shown may take any suitable form. For instance any one or more of the antennas may be any one of a dipole antenna, a slot antenna, PIFA (Planar Inverted F Antenna) antenna, meander lines, chip antennas, among other examples, capable of receiving and transmitting a wireless signal. Dipole antennas, for instance, may have use in an application having tight space constraints, such as may be found in some playback devices.

In an example any one of the antennas may be a dual band antenna capable of receiving and transmitting a wireless signal in two different frequency spectrums. For instance, the antenna may be a dual band antenna capable of receiving and transmitting on both the 2.4 gHz and 5 gHz wireless spectrums.

Using one or more of the antennas, the playback device may transmit and receive information including audio information, configuration information, and/or control information to and from one or more other networked devices. Configuration and control information can be used to cause the playback device to serve as a master or coordinating device, for example. Additionally or alternatively, the configuration and control information may be used to provide multimedia content to one or more devices in the same zone, different zones, or same and different zones as the playback device.

Each antenna in the playback device may be understood to have a longitudinal axis running lengthwise corresponding to the longest dimension of the antenna. In FIG. 7A, example playback device 700 is shown in a first example orientation of vertical. As shown in FIG. 7A, the orientation of the longitudinal axis of each antenna in the first set of antennas 702A, 702B, and 702C, represented by arrow 706, is vertical. Similarly, as shown in FIG. 7A, the orientation of the longitudinal axis of playback device 700, represented by arrow 706, is vertical. Accordingly, as shown in FIG. 7A, the respective longitudinal axis of the network device and each antenna in the first set of one or more antennas is substantially parallel.

As further shown in FIG. 7A, the orientation of the longitudinal axis of each antenna in the second set of antennas 704A, 704B, and 704C, represented by arrow 708, is horizontal. Accordingly, as shown in FIG. 7A, the respective longitudinal axis of each antenna in the second set of one or more antennas is substantially perpendicular to the respective longitudinal axis of the network device and each antenna in the first set of one or more antennas.

With reference to FIG. 7B, example playback device 700 is shown in a second example orientation of horizontal. As shown in FIG. 7B, the orientation of the longitudinal axis of each antenna in the first set of antennas 702A, 702B, and 702C, represented by arrow 708, is horizontal. Similarly, as shown in FIG. 7B, the orientation of the longitudinal axis of playback device 700, represented by arrow 708, is horizontal. Accordingly, as shown in FIG. 7B, the respective longitudinal axis of the network device and each antenna in the first set of one or more antennas remains substantially parallel.

As further shown in FIG. 7B, the orientation of the longitudinal axis of each antenna in the second set of antennas 704A, 704B, and 704C, represented by arrow 706, is vertical. Accordingly, as shown in FIG. 7B, the respective longitudinal axis of each antenna in the second set of one or more antennas remains substantially perpendicular to the respective longitudinal axis of the network device and each antenna in the first set of one or more antennas.

Returning now to implementation 500, at block 504, if the determined orientation is the first orientation, method 500 involves then causing the network device to communicate using the first set of one or more antennas. With respect to the example first orientation depicted in FIG. 7A, playback device 700 would cause communication using the first set of one or more antennas 702A, 702B, and 702C.

In accordance with block 504, in one example playback device 700 may receive control information via the first set of one or more antennas. Additionally and/or alternatively, playback device 700 may receive configuration information via the first set of one or more antennas. Additionally and/or alternatively, playback device 700 may receive audio information via the first set of one or more antennas.

In accordance with block 504 in another example, playback device 700 may additionally and/or alternatively send control information via the first set of one or more antennas. Additionally and/or alternatively, playback device 700 may send configuration information via the first set of one or more antennas. Additionally and/or alternatively, playback device 700 may send audio information via the first set of one or more antennas.

Notably, causing the playback device to communicate using the first set of antennas when the playback device is in a vertical orientation, where each antenna in the first set of antennas therefore also has a vertical orientation, will cause the radiation pattern of the collective first set of antennas to be beneficially concentrated in the azimuth of the playback device. As will be discussed further below with respect to block 506, when the playback device is then rotated 90 degrees and placed in a horizontal orientation, causing the playback device to instead communicate using the second set of antennas where each antenna in the second set of antennas then has a vertical orientation, will cause the radiation pattern of the collective second set of antennas to also be beneficially concentrated in the azimuth.

Figure 9:
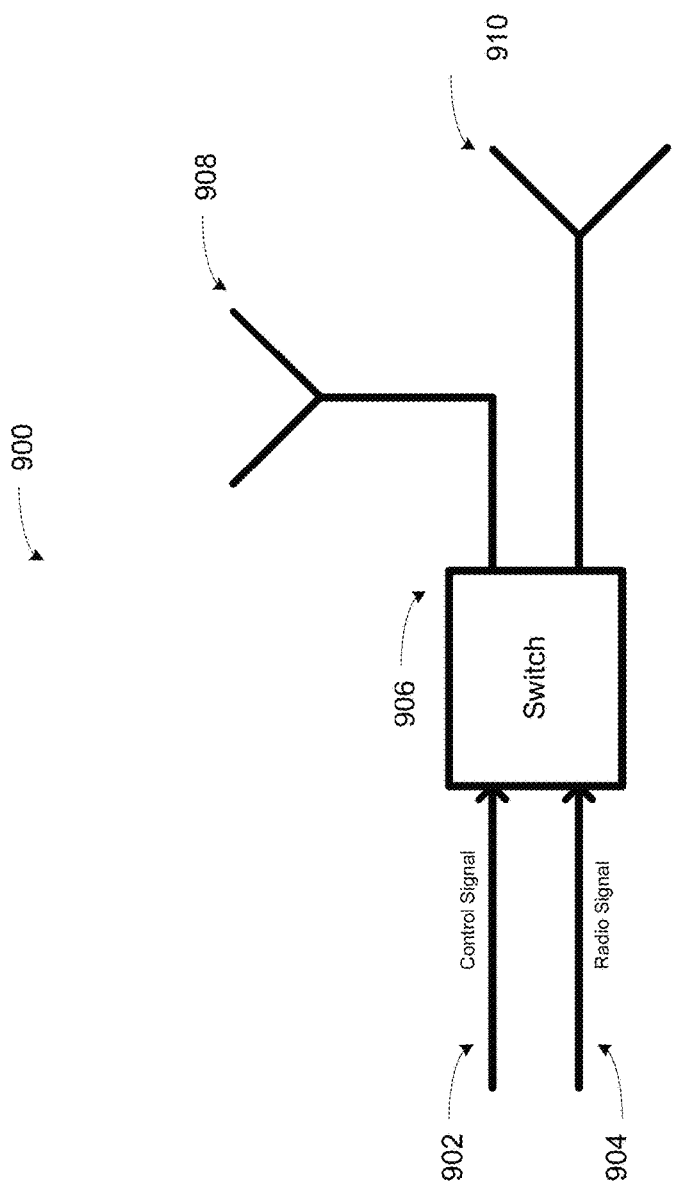
FIG. 9 shows a functional diagram of a switch for causing communication via a first antenna or a second antenna, according to an example implementation.

Causing the network device to communicate using the first set of one or more antennas may involve enabling the first set of one or more antennas. In one example, enabling an antenna may involve causing a given radio signal for transmission or receipt to be communicated via the antenna. For instance, as shown in FIG. 9, enabling antenna 908 may involve causing radio signal 904 to be transmitted via antenna 908. A switch 906 may be implemented, operable based on control signal 902, to direct the radio signal along a signal path to antenna 908.

In accordance with block 504, causing the network device to communicate using the first set of one or more antennas may further involve disabling the second set of one or more antennas. In one example, disabling an antenna may involve preventing a given radio signal for transmission or receipt to be communicated via the antenna. For instance, as shown in FIG. 9, disabling antenna 910 may involve operating switch 906, based on control signal 902, to foreclose a signal path for the control signal to antenna 910 such that communication via antenna 910 is disabled. At the same time, as discussed above, communication via antenna 908 may be enabled.

Continuing with examples discussed above, in an example scenario, in accordance with block 502, a microprocessor of a playback device may determine an orientation of the playback device using a signal received from an accelerometer of the playback device. Then, in accordance with block 504, the microprocessor may, perhaps together with other logic implemented in software and/or hardware, select one or more antennas to be enabled. As a result, a switch may be triggered to cause the playback device to communicate via the selected one or more antennas.

It should be noted that, in addition to causing the playback device to communicate using certain antennas, other functions may be performed based on the orientation of the playback device. For instance, in addition to causing communication by certain antennas, if the determination is that the orientation is the first orientation, then the playback device may also be configured to reproduce sound according to a first equalization setting. Additionally and/or alternatively, if the determination is that the orientation is the first orientation, then the playback device may also be configured to reproduce a given channel of a multi-channel audio signal. Other example aspects of changing an equalization setting of playback device based on orientation are described in U.S. patent application Ser. No. 13/186,249, filed Jul. 19, 2011, entitled "Shaping Sound Responsive to Speaker Orientation," which is incorporated by reference herein.

C. If Determination is that Orientation is Second Orientation, then Causing Network Device to Communicate Using Second Set of One or More Antennas At block 506, implementation 500 involves, if the determined orientation is the second orientation, then causing the network device to communicate using the second set of one or more antennas.

As discussed above, FIG. 7B shows example playback device 700 in a second example orientation of horizontal. In such a situation where playback device 700 is in a horizontal orientation, in accordance with block 506 playback device 700 may be caused to communicate using the second set of one or more antennas 704A, 704B, and 704C. As a result, because as discussed above the respective longitudinal axis of playback device 700 and each antenna in the second set of one or more antennas is substantially perpendicular, the radiation pattern of the collective set of second antennas will be beneficially concentrated in the azimuth.

The second set of one or more antennas may be enabled in a manner similar to that described above with respect to the first set of one or more antennas. Moreover, in addition to causing communication by the second set of one or more antennas, if the determination is that the orientation is the second orientation, then the playback device may also be configured to reproduce sound according to a second equalization setting. The playback device may be configured to reproduce sound according to the second equalization setting in a manner similar to that in which the playback device is configured to reproduce sound according to the first equalization setting, as discussed above.

IV. Additional Example Antenna Sets

In the examples provided above with respect to method 500, including in particular the examples shown in FIGS. 7A and 7B, the respective longitudinal axis of each antenna in the second set of one or more antennas is substantially perpendicular to the respective longitudinal axis of the network device and each antenna in the first set of one or more antennas. However, it should be understood that this is not necessary. Indeed, in some embodiment, the first and second set of antennas may not be mutually exclusive, and instead one or more antennas may be shared between the first set of antennas and the second set of antennas.

Figure 8B:
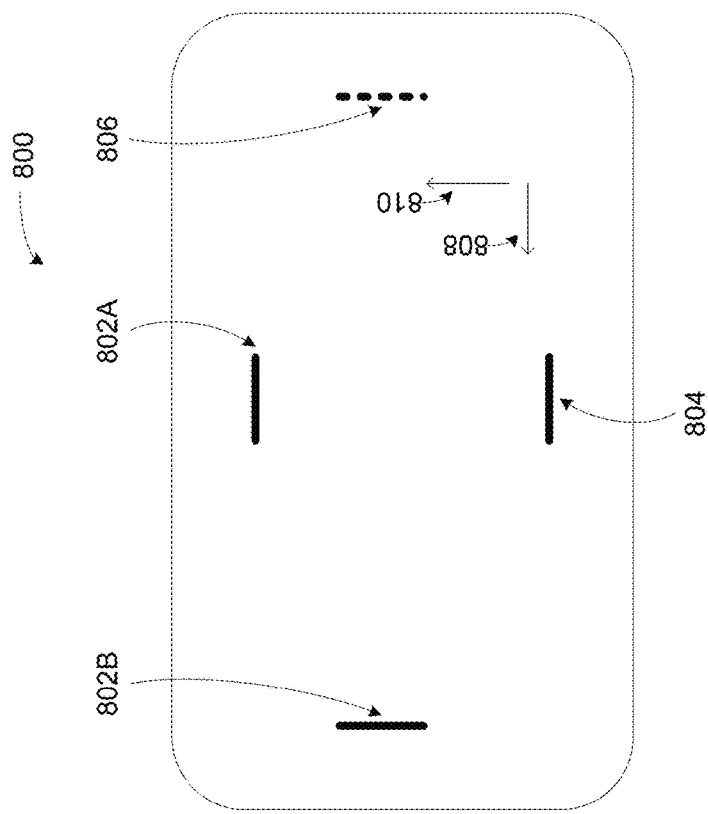
FIGS. 8A and 8B show an example playback device including additional example antennas, according to an example implementation.
Figure 8A:
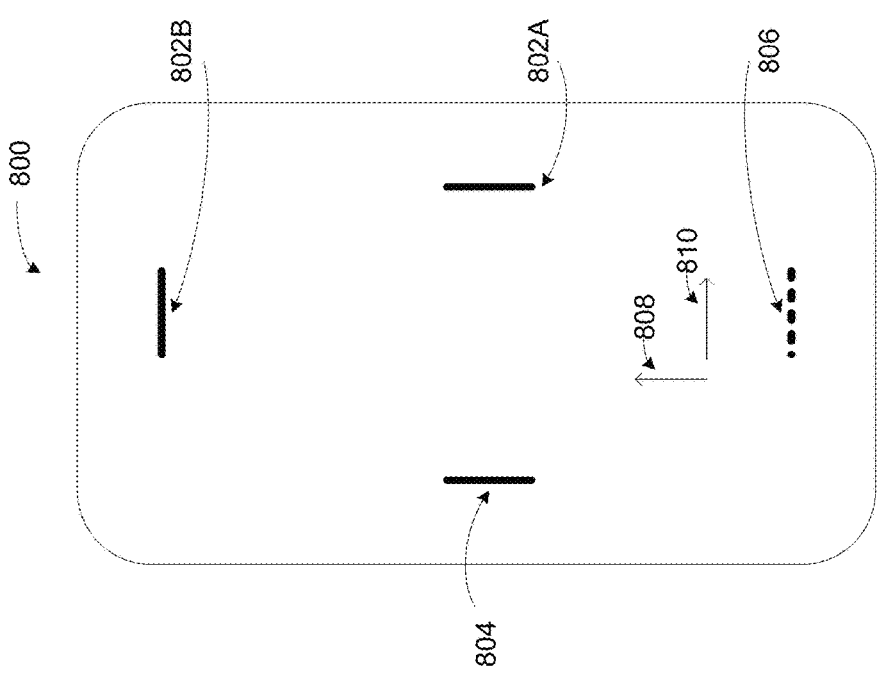

An example embodiment where the first set of one or more antennas and the second set of one or more antennas share an antenna is shown with respect to FIGS. 8A and 8B. In particular, the first set of antennas may be understood to include antenna 802A, antenna 802B, and antenna 804. On the other hand, the second set of antennas may be understood to include antenna 802A, antenna 802B, and antenna 806.

As shown in FIG. 8A, playback device 800 is oriented substantially vertical. Moreover, the longitudinal axis of each of antenna 802A and antenna 804A is also oriented substantially vertical, as indicated by arrow 808. In this way, the longitudinal axis of antenna 802A and the longitudinal axis of antenna 804 are substantially parallel.

As also shown in FIG. 8A, the longitudinal axis of each of antenna 802B and antenna 806 is oriented substantially vertical, as indicated by arrow 810. In this way, the longitudinal axis of antenna 802B and the longitudinal axis of antenna 806 are substantially perpendicular to the longitudinal axis of antenna 802A and the longitudinal axis of antenna 804.

If in the first vertical orientation shown in FIG. 8A, playback device 800 may communicate using the first set of antennas 802A, 802B, and 804. While in such an arrangement antenna 802A and 804 are parallel and so their radiation patterns will be aligned along the azimuth, the longitudinal axis of antenna 802B is oriented perpendicular. In some situations it may nonetheless be desirable to communicate using a set of antennas having such different respective orientations. One such situation may arise, for example, if the geographic location in which the playback device is used permits only a certain number of active antenna to be orientated in a common direction.

If in the second vertical orientation shown in FIG. 8B, playback device 800 may communicate using the second set of antennas 802A, 802B, and 806. While in such an arrangement antenna 802B and 806 are parallel and so their radiation patterns will be aligned along the azimuth, the longitudinal axis of antenna 802A is oriented perpendicular.

Notably, although no other antennas are shown as included in playback device 800, other such antennas may be included. For instance, any antenna corresponding to the antennas shown with respect to FIGS. 7A and 7B may be included, while not used when playback device operates according the embodiment described with respect to FIGS. 8A and 8B.

More generally, while certain sets of antennas are described with respect FIGS. 7A, 7B, 8A, and 8B, it should be understood that method 500 may be carried out by a playback device that includes more or less antennas. Furthermore, the antennas may assume orientations other than those explicitly mentioned herein.

V. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, the examples provided herein involve causing a network device to communicate with one or another set of antennas depending on an orientation of the network device. In one aspect, a network device is provided. The device includes a first set of one or more antennas, a second set of one or more antennas, a processor, and memory having stored thereon instructions executable by the processor to cause the device to perform functions. The functions include (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

In another aspect, a method is provided. The method involves (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

In yet another aspect, a non-transitory computer readable memory is provided. The non-transitory computer readable memory has stored thereon instructions executable by a computing device to cause the computing device to perform operations. The operations include (1) determining that an orientation of the network device is one of a first orientation and a second orientation; (2) if the determined orientation is the first orientation, then causing the network device to communicate using the first set of one or more antennas; and (3) if the determined the orientation is the second orientation, then causing the network device to communicate using the second set of one or more antennas.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A network device, the network device comprising a housing carrying:
   a first set of antennas comprising a first antenna and a second antenna, wherein respective longitudinal axes of the first and second antennas are substantially parallel to a longitudinal axis of the housing, wherein the first antenna is offset from the second antenna such that the first antenna is not horizontally aligned with the second antenna when the network device is in a first orientation and the first antenna is not vertically aligned with the second antenna when the network device is in a second orientation, and wherein the longitudinal axis is the longest axis of the housing;

a second of set antennas comprising a third antenna and a fourth antenna, wherein respective longitudinal axes of the third and fourth antennas are substantially perpendicular to the longitudinal axis of the housing, and wherein the third antenna is offset from the fourth antenna such that the third antenna is not horizontally aligned with the fourth antenna when the network device is in the first orientation and the third antenna is not vertically aligned with the fourth antenna when the network device is in the second orientation;

a processor; and a tangible non-transitory computer-readable memory having stored thereon instructions executable by the processor to cause the processor to perform functions comprising:

determining that an orientation of the network device is one of the first orientation and the second orientation;

if the determined orientation is the first orientation, then causing the network device to communicate using the first set of antennas; and if the determined the orientation is the second orientation, then causing the network device to communicate using the second set of antennas.

2. The network device of claim 1, wherein the first set of antennas consists of the first and second antennas, and wherein the second set of antennas consists of the third and fourth antennas.

3. The network device of claim 1, wherein causing the network device to communicate using the first set of antennas comprises causing the network device to receive at least one of control information and audio information via the first set of antennas, and wherein causing the network device to communicate using the second set of antennas comprises causing the network device to receive at least one of control information and audio information via the second set of antennas.

4. The network device of claim 1, wherein causing the network device to communicate using the first set of antennas comprises enabling the first set of antennas and disabling the second set of antennas, and wherein causing the network device to communicate using the second set of antennas comprises disabling the first set of antennas and enabling the second set of antennas.

5. A method comprising:

determining, via a network device, that an orientation of the network device is one of a first orientation and a second orientation;

if the determined orientation is the first orientation, then causing the network device to communicate using a first set of antennas comprising a first antenna and a second antenna, wherein respective longitudinal axes of the first and second antennas are substantially parallel to a longitudinal axis of a housing carrying the first set of antennas and a second set of antennas, wherein the longitudinal axis is the longest axis of the housing, and wherein the first antenna is offset from the second antenna such that, in the first orientation, the first antenna is not horizontally aligned with the second antenna and, in the second orientation, the first antenna is not vertically aligned with the second antenna; and if the determined orientation is the second orientation, then causing the network device to communicate using the second set of antennas, the second set of antennas comprising a third and a fourth antenna, wherein respective longitudinal axes of the third and fourth antennas are substantially perpendicular to the longitudinal axis of the housing, and wherein the third antenna is offset from the fourth antenna such that, in the first orientation, the third antenna is not horizontally aligned with the fourth antenna and, in the second orientation, the third antenna is not vertically aligned with the fourth antenna.

6. The method of claim 5, wherein the first set of antennas consists of the first and second antennas, and wherein the second set of antennas consists of the third and fourth antennas.

7. The method of claim 5, wherein causing the network device to communicate using the first set of antennas comprises: (i) disabling the second set of antennas and (ii) causing the network device to receive at least one of control information and audio information via the first set of antennas, and wherein causing the network device to communicate using the second set of antennas comprises: (i) disabling the first set of antennas and (ii) causing the network device to receive at least one of control information and audio information via the second set of antennas.

8. A non-transitory computer readable medium having stored thereon instructions executable by a processor of a network device to cause the processor to perform functions comprising:

determining that an orientation of the network device is one of a first orientation and a second orientation;

if the determined orientation is the first orientation, then causing the network device to communicate using a first set of antennas comprising a first antenna and a second antenna, wherein respective longitudinal axes of the first and second antennas are substantially parallel to a longitudinal axis of a housing carrying the first set of antennas and a second set of antennas, wherein the longitudinal axis is the longest axis of the housing, and wherein the first antenna is offset from the second antenna such that, in the first orientation, the first antenna is horizontally aligned with the second antenna and, in the second orientation, the first antenna is vertically aligned with the second antenna; and if the determined orientation is the second orientation, then causing the network device to communicate using the second set of antennas, the second set of antennas comprising a third and a fourth antenna, wherein respective longitudinal axes of the third and fourth antennas are substantially perpendicular to the longitudinal axis of the housing, and wherein the third antenna is offset from the fourth antenna such that, in the first orientation, the third antenna is horizontally aligned with the fourth antenna and, in the second orientation, the third antenna is vertically aligned with the fourth antenna.

9. The non-transitory computer readable medium of claim 8, wherein the first set of antennas consists of the first and second antennas, and wherein the second set of antennas consists of the third and fourth antennas.

10. The non-transitory computer readable medium of claim 8, wherein causing the network device to communicate using the first set of antennas comprises: (i) disabling the second set of antennas and (ii) causing the network device to receive at least one of control information and audio information via the first set of antennas, and wherein causing the network device to communicate using the second set of antennas comprises: (i) disabling the first set of antennas and (ii) causing the network device to receive at least one of control information and audio information via the second set of antennas.

11. The non-transitory computer readable medium of claim 8, wherein the functions further comprise:
    if the determination is that the orientation is the first orientation, then configuring the network device to reproduce sound via one or more transducers according to a first equalization setting; and
    if the determination is that the orientation is the second orientation, then configuring the network device to reproduce sound via the one or more transducers according to a second equalization setting.

12. The non-transitory computer readable medium of claim 8, wherein the respective longitudinal axes of the first and second antennas are parallel to the longitudinal axis of the housing.

13. The non-transitory computer readable medium of claim 12, wherein the respective longitudinal axes of the third and fourth antennas are perpendicular to the longitudinal axis of the housing.

14. The network device of claim 1, wherein the network device is a playback device and further comprises one or more amplifiers configured to drive one or more transducers.

15. The network device of claim 14, wherein the functions further comprise:
    if the determination is that the orientation is the first orientation, then configuring the network device to reproduce sound via the one or more transducers according to a first equalization setting; and
    if the determination is that the orientation is the second orientation, then configuring the network device to reproduce sound via the one or more transducers according to a second equalization setting.

16. The network device of claim 1, wherein the respective longitudinal axes of the first and second antennas are parallel to the longitudinal axis of the housing.

17. The network device of claim 16, wherein the respective longitudinal axes of the third and fourth antennas are perpendicular to the longitudinal axis of the housing.

* * * * *